United States Patent [19]

Bowers

[11] 4,008,079

[45] Feb. 15, 1977

[54] SUPERCONDUCTING ALLOYS

[75] Inventor: John Edwin Bowers, Wantage, England

[73] Assignee: International Lead Zinc Research Organization, Inc., New York, N.Y.

[22] Filed: Mar. 17, 1975

[21] Appl. No.: 558,623

[30] Foreign Application Priority Data

Mar. 20, 1974 United Kingdom ............ 12492/74

[52] U.S. Cl. .......................... 75/134 T; 75/166 R; 75/166 B
[51] Int. Cl.² ........................................ C22C 11/08
[58] Field of Search ......... 75/166 B, 166 R, 134 T, 75/134 D, 134 B, 134 N

[56] References Cited

UNITED STATES PATENTS

| | | | |
|---|---|---|---|
| 1,681,272 | 8/1928 | Yoshikawa | 75/166 B |
| 2,325,071 | 7/1943 | Murray | 75/166 R |

FOREIGN PATENTS OR APPLICATIONS 1,137,427  12/1968  United Kingdom ............ 75/134 T

*Primary Examiner*—G. Ozaki
*Assistant Examiner*—E. L. Weise
*Attorney, Agent, or Firm*—Larson, Taylor and Hinds

[57] ABSTRACT

Lead based Type II superconducting alloys having high critical current densities are described. The alloys of the invention are characterized by having a matrix of lead and bismuth and/or indium and having a dispersion of particles of copper, tellurium, selenium, nickel, manganese, calcium, chromium, cerium, germanium or lanthanum or of compounds of these with the matrix constituents having an average particle size less than 2 preferably less than 0.5 microns. The alloys of the invention are preferably made by splat casting.

12 Claims, 8 Drawing Figures

FIG. 1
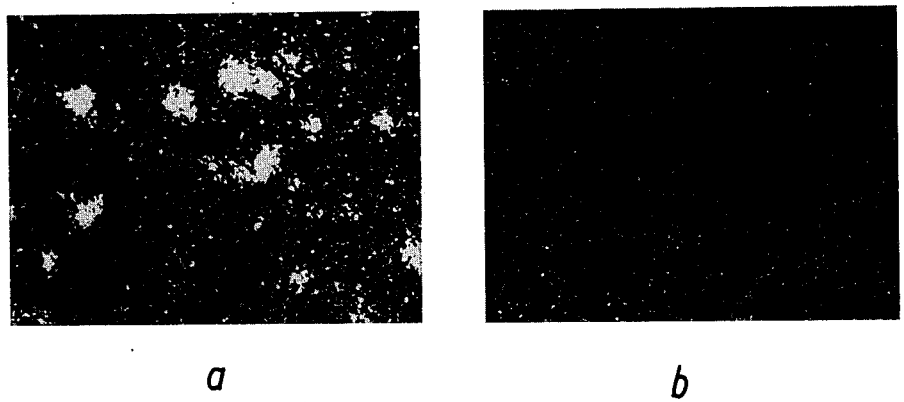
a                    b
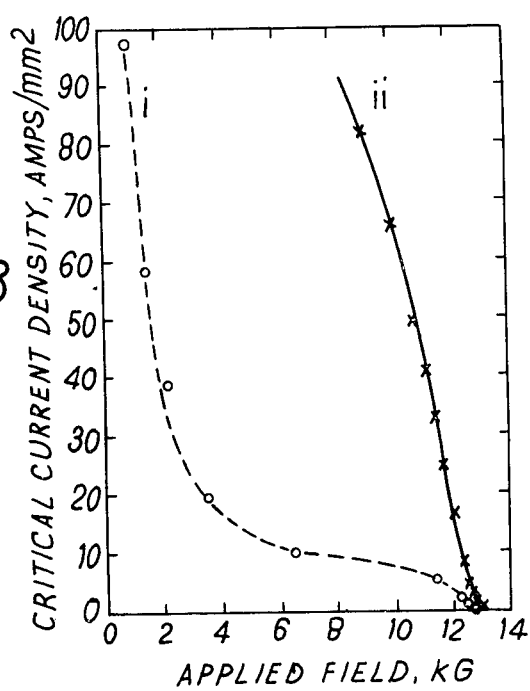
FIG. 3

SUPERCONDUCTING ALLOYS

The present invention relates to Type II superconducors and in particular to Type II superconductors having high critical currents.

In recent years there has been considerable interest in practical and commercial application of superconducting materials. One application which has been studied is the use of superconducting cables in electrical power transmission lines. Resistance losses in power cables amount to up to 1% of power produced. Considering the very large amounts of power generated and transmitted it is clear that elimination of or reduction of at least a substantial proportion of resistance losses could result in considerable savings. Also in some areas superconducting cables could have economic advantages over conventional cables of the same capacity. The drawbacks to this application of superconductors are principally the technological difficulty associated with maintaining the cable in the superconducting state and the capital cost of the superconducting cable system. Systems at present under development include cables using superconducting elements of, for example, niobium — tin or niobium — titanium alloys. Niobium metal is itself very expensive and the techniques of working the alloy to produce a suitable conductor are both difficult and expensive. The cost of niobium alloy, in the form of a suitable conductor, is a significant aspect of the capital cost of a superconducting cable system using it. Attempts have been made to find other suitable alloys. One such attempt is described in British Patent Specification No. 1137427. This specification describes a system of alloys based on lead and incorporating a dispersion of fine particles of oxides of the lead and/or other alloying component. The alloys produced have improved (upper) critical currents at moderate applied fields. As used herein reference to 'critical' parameters of Type II superconductors is to be understood as being to 'upper critical' parameters. In superconducting cable technology the applied fields are usually fairly low, less than 5 kG and the critical field is not likely to be a limiting factor for systems having at least moderately high critical temperatures. The alloys described in this prior specification suffer from certain disadvantages in that the oxides produced tend to combine chemically with water or carbon dioxide to produce thermally unstable hydroxides or carbonates. Decomposition of such materials incorporated in the alloy can cause blistering if the alloy is heat-processed e.g., by extruding at high temperatures or soldering or welding. Also the process used for preparing the oxide dispersion gives a non-uniform dispersion of coarse oxide particles. These problems can be overcome but at the expense of increased cost of manufacture. Further, the oxide dispersion reduces the ductility of the alloy and at high levels of oxide, which are advantageous from the improvement in superconducting properties, the reduction in ductility can be so marked as to make working of the alloys difficult.

In Specification No. 1137427 the particles of oxide dispersed in the alloy act as pinning centres for Abrikosov flux vortices thus allowing much higher values of critical current to be attained than in the unmodified alloy. The present invention is directed to an alternative way of providing pinning centres and in particular to providing smaller and more closely spaced pinning centres.

In a first aspect the present invention provides an alloy comprising a matrix of a Type II superconductor, which is an homogeneous mixture of lead with bismuth and/or indium, including, dispersed in the matrix, a material to provide pinning centres comprising at least 0.01% by volume of a stable discontinuous phase comprising discrete crystalline particles of copper, manganese, tellurium, selenium, nickel, calcium, chromium, cerium, germanium or lanthanum either in the form of the element or of a compound with at least one of the components of the matrix, wherein the discrete particles have an average diameter of not more than 2 microns, preferably not more than 0.5 microns.

It is possible to make Type II superconductors of the present type by using thallium or sodium as the other constituent of the lead based alloy, However, these materials are not as useful as alloys using indium and/or bismuth. Further thallium is very toxic and sodium produces chemically reactive alloys which may not be stable in an operational environment.

A second aspect of the invention provides an alloy comprising a matrix of a Type II superconductor including, dispersed in the matrix, a material to provide pinning centres comprising at least 0.01% by volume of a stable discontinuous phase in the form of discrete particles having an average diameter of not more than 2 microns and formed by cooling an homogeneous liquid mixture of the alloy components at an average cooling rate of at least $10^3$ °C. sec$^{-1}$, preferably more than $10^5$ °C. sec$^{-1}$, to a temperature at which the alloy is substantially completely solid.

The invention also provides superconducting elements made from or comprising the alloy of the invention at a temperature below its critical temperature.

BRIEF DESCRIPTION OF THE DRAWINGS

FIG. 1 (a and b) shows scanning electron micrographs of an alloy of the invention.

FIGS. 3 and 4 are plots of critical current density versus applied magnetic field for alloys of the invention.

Figure 2:
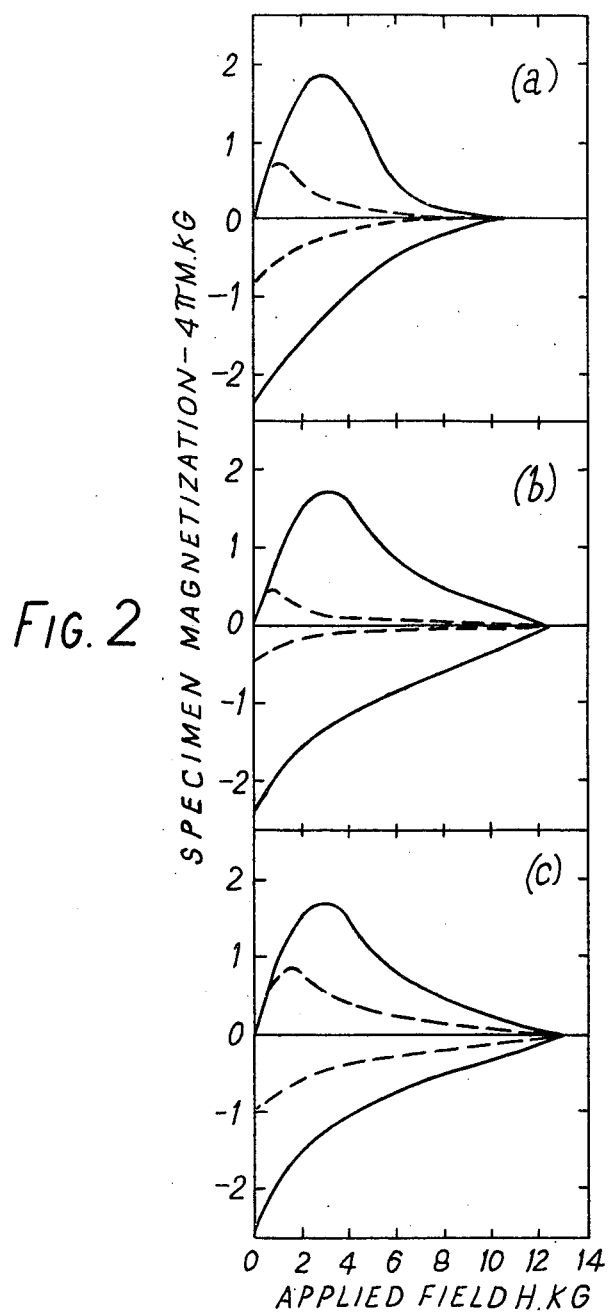
FIGS. 2 (a, b, and c) and 5 show plots of magnetization versus applied magnetic field for various alloys of the invention.

In practice, cryogenic systems are operated at or about 4.2° K because this is the normal boiling point of liquid helium and can therefore be maintained fairly straight-forwardly. It is thus preferred to use alloys having critical temperatures somewhat in excess of this figure in order to obtain practically useful values of critical current at operational magnetic fields. One type of basic alloy system which is useful and which has been studied previously, see e.g., British Pat. Specification No. 1137472, is the Pb - X system where X is indium, and/or bismuth. The composition of the alloys are limited in respect of the proportion of X to a minimum figure at least sufficient that the alloy is a Type II superconductor. The preferred upper figure is limited by the phase stability of the material. In general the matrix alloys used in the invention should contain a minimum of 50% of lead and a minimum of 5% of bismuth or 10% of indium. The following are preferred practical ranges for the amount of X in atom percent based on the total alloy:

indium 30 to 50 bismuth 15 to 40

These figures may be modified somewhat depending upon manufacturing and working temperatures because metallurgical stability is a function of temperature. In general the critical field increases with the increase in the proportion of X and so alloys having relatively high proportions of non-lead component are preferred. For a Pb-Bi alloy convenient proportions are from 30 to 40 atom % Bi, particularly about 35% Bi.

The particles forming the discontinuous phase are of a material which is insoluble in the solid matrix. The precise composition of the discontinuous phase in any particular instance will thus depend to some extent on the composition of the matrix.

In general the products of the invention are made in the first instance by freezing an homogeneous molten solution of the basic components of the alloy at a cooling rate of at least $10^3$ ° C. $sec^{-1}$, preferably at least $10^5$ ° C. $sec^{-1}$, thus precipitating the discontinuous phase in the form of particles having an average diameter of not more than 2 microns, preferably less than this, e.g. 0.5 microns, and optimally not more than 0.1 microns. Since particle size is a function of cooling rate and the latter is determined by the freezing technique used, particle size will be discussed later in connection with the different techniques. Broadly, the method of providing the discontinuous phase is to incorporate in solution in the molten base alloy e.g. Pb/35% Bi, a proportion of a material which will, on cooling, either itself precipitate out of solution as discrete particles or combine with one or more of the components of the basic alloy to precipitate at least one type of discontinuous phase on cooling. The phases formed may depend on cooling rate as well as on the composition of the alloy as, at the high cooling rates employed, metastable phases may form.

Typical additive materials and the phases likely to be precipitated are listed in Table I in relation to the alloying components of the lead alloys mentioned above. As these ternary systems have not been fully investigated there may be other binary and ternary compounds precipitated in addition to those listed.

TABLE 1

| Additive Material | Basic Alloy Pb/Bi | Pb/In |
|---|---|---|
| Cu | Cu | Cu |
|  |  | $Cu_9 In_4$ |
| Mn | Mn | Mn |
|  | BiMn | $Mn_3In$ |
| Ni | Ni | $Ni, Ni_3In_7$ |
|  | $Bi_3Ni$ | $Ni_2In_3$ |
| Ca | $Pb_3Ca$ | $Pb_3Ca, CaIn$ |
|  | $Bi_3Ca$ | $CaIn_3$ |
| Se | BiSe | $In_2Se$ |
|  | PbSe | PbSe |
| Te | PbTe | PbTe |
|  | $Bi_2Te_3$ | In Te |
| Cr | Cr | Cr |
| Ce | $Pb_3Ce$ | $Pb_3Ce$ |
|  | $Bi_2Ce$ | $CeIn_3$ |
| Ge | Ge | Ge |
| La | $Pb_3La$ | $Pb_3La$ |
|  | BiLa |  |

From theoretical considerations it is strongly preferred that the discontinuous phase does not have significant para-, ferro-, or antiferromagnetic properties at superconducting temperatures. Possession of such magnetic properties would have a deleterious effect on the ability of the particles to act as pinning centres. Thus, although manganese can provide pinning centres, it is less effective than might otherwise be expected because it tends to be precipitated in the form of paramagnetic compounds. Further, it is preferred that the particles are not of a material which, itself, is a superconductor under operating conditions. It is thought possible that the phase discontinuity might itself act as a pinning centre, but this would be expected to be weaker than the pinning action of a non-superconducting particle under the same conditions.

Of the disperse phase forming materials used in the invention copper and especially nickel, selenium and tellurium are preferred.

The amount of material forming the discontinuous phase added to the molten base alloy is preferably sufficient to produce between 0.01 and 20% by volume of discontinuous phase. For additives precipitated unchanged the amount added will be in this range after allowing for density differences and thermal expansion effects. For additives forming compounds the volume of precipitate required is achieved with a lower atomic % of additive, depending on the stoichiometry of the compound formed. The lower limit is determined by practical considerations of providing a significant improvement in superconductive properties. The upper level of discontinuous phase is limited by diminishing returns, in terms of improvement of critical current for increased additions and by difficulties associated with solubility in the molten state and the tendency at higher concentrations to form larger particles unless very high cooling rates are employed. Although useful alloys are possible in this broad range of concentration the most significant improvements, particularly when compared with the level of addition, are obtained in the range of 0.05 to 7.0%, especially 0.1 to 2.0% by volume of discontinuous phase. It should be noted that, to a certain extent the practically obtainable optimum concentration depends on the nature of the discontinuous phase. This is believed to be largely a function of solubility in the melt and the degree of supersaturation during freezing.

The general method used to produce the alloys of the invention is by rapid quenching of a molten solution of the appropriate additive in the basic alloy. In order to prevent the formation of relatively large particles of disperse phase the cooling rate must be at least $10^3$ ° C. $sec^{-1}$. However, it is highly preferred to provide the disperse phase in as finely divided form as reasonably possible. It is thus preferred to cool the molten solution at a rate of at least $10^5$ ° C. $sec^{-1}$ and more preferably at about $10^6$ ° C. $sec^{-1}$. Cooling rates of $10^3$ ° C. $sec^{-1}$ can be achieved using the technique of chill casting and thus it is possible to make some of the alloys of the invention by chill casting. However, $10^3$ ° C. $sec^{-1}$ represents very nearly the maximum rate of cooling attainable using chill casting and this rate tends to produce relatively coarse dispersions typically in the range of 1 to 2 microns average diameter a significant proportion of particles being up to 10 microns in diameter. These are not very preferred alloys of the invention. In order to obtain particle size in the preferred ranges of the invention, i.e. less than 0.5 microns and optimally less than 0.1 microns, it is necessary to use higher rates of cooling e.g. greater than $10^5$ ° C. $sec^{-1}$, preferably about or greater than $10^6$ ° C. $sec^{-1}$. This order of rate of cooling can be obtained by splat casting. In splat casting a liquid to be quenched is atomised and sprayed on to a cooled surface, usually the outer surface of an internally cooled cylinder. On impacting on to the cooled surface the atomised droplets of liquid spread out and are rapidly cooled to form a flake. Cooling rates of greater than $10^7$ °C. sec$^{-1}$ are possible, but in practice cooling rates much in excess of $10^6$ °C. sec$^{-1}$ are difficult to maintain in large-scale production. The practical limit on the rate of cooling is not a limit on the concept of the invention, merely on the techniques at present available to carry it out. Development of techniques giving even higher rates of cooling will enable finer particles to be precipitated and are thus included in the broad concept of the present invention.

With cooling rates of about $10^6$ °C. sec$^{-1}$ alloy flake containing dispersed particles of about 0.1 microns average diameter can be cast. Clearly the average spacing between particles is a function of particle size and concentration, but in general for a given concentration of discontinuous phase the interparticle spacing should be minimised.

The conditions of operation of the splat casting process are governed by factors known in the art. However, the following points should be noted. In order to ensure uniform fine particle formation the additive which comprises or stimulates disperse phase precipitation should be completely dissolved in the molten alloy before spraying. This may mean forming the solution at a temperature considerably in excess of the melting point of the basic alloy. For example, with a typical Pb/Bi alloy copper is only very slightly soluble (ca. 0.1% by weight) at normal melting temperatures. In order to use additions of about 1% copper it is advisable to heat the molten alloy to 500° C. above the normal melting point of the basic alloy. In practice the maximum temperature for lead alloys is limited by the vapour pressure of lead to not higher than about 1100° C, and preferably not higher than 1000° C. for unsealed apparatus. In order to prevent premature and thus uncontrolled precipitation it is advisable to heat the molten solution to 50° to 150° C. optimally about 100° C. above the liquidus of the mixture, i.e. the temperature at which the disperse phase forming material is completely in solution in the melt. In order to avoid undesirable contamination e.g. by oxidation of the alloy when molten it is advisable to keep the surface of the molten alloy under an inert or reducing atmosphere, e.g. $N_2$ or 90% $N_2$/ 10% $H_2$. The particular choice of atmosphere will be easily made by those skilled in the art. In the lead based alloys described above, oxidation should be avoided for three reasons. Firstly, oxygen and the oxides of the alloying metals are in general not soluble in the alloys and tend to form regions of relatively large particle sizes and to distrub the relative proportions of the various alloy components. Secondly, oxide formation may be very rapid and highly exothermic especially in lead/sodium alloys. Thirdly, at melt temperatures lead oxide is very corrosive attacking both acidic and basic furnace linings. In splat casting to produce fine particle precipitation it is essential that substantially no precipitation occurs before droplet impact on the cooled surface. If precipitation does start before impact there is a tendency to form relatively large particles of discontinuous phase. Choice of correct melting temperature avoids such premature precipitation. On impact on the cooled surface the droplets splat and are rapidly cooled and freeze. When the cooled surface is the external surface of an internally cooled drum the system is usually provided with a scraper to dislodge flakes adhering to the surface of the drum. For most metals and alloys the cooled drum is conveniently a water-cooled chromium-plated copper drum, which is rotated to present a continuous fresh cool surface for impact.

The flake obtained from splat casting can be formed by conventional powder metallurgy techniques. However, the alloy should not be heated to a temperature higher than that at which substantial increase in the particle size of the discontinuous phase occurs. This temperature will depend on the particular system employed in a given case. Conversely, however, the preferred techniques of the invention involve cooling at such high rates that the product may contain "disperse phase forming material" frozen in (supercooled) solid solution. Thermal aging of such materials can stimulate further and beneficial precipitation of the disperse phase.

The lead based alloys of and produced by the process of the present invention have critical temperatures typical of superconducting lead alloys i.e. about 7° K. The critical fields are not very significantly higher than those of equivalent alloys not including the dispersed phase, i.e. about 10 to 15 kG. However, very marked increases of critical current can be achieved. Improvements by a factor of $10^2$ to $10^3$ are readily obtained with copper additions of as little as 0.1% by weight in a splat cast alloy.

Alloys of this invention advantageously have a critical current density at 4.2° K and an applied field of 7 kG, of at least 80 A mm$^{-2}$. The alloys are expected to have utility primarily in situations where a high critical current is required in a relatively low applied field, for example in power transmission cables. The alloys may also have other uses, for example, in the outer windings of cryogenic motors or magnets.

The following Examples illustrate the invention:

PRODUCTION OF ALLOYS

Two techniques are used to prepare samples of the alloys for testing:

1. Chill casting.

Chill castings were produced by melting the alloy components under a 90/10 nitrogen-hydrogen atmosphere using an electrical resistance furnace. The melts were cast into a split graphite mould to produce 12.7 mm. and 6.35 mm diameter rods. The 12.7 mm diameter rods were rolled at room temperature to give 270 mm × 10 mm × 0.5 mm specimens which were used for determination of the critical current, the 6.35 mm diameter rods were drawn to 2.3 mm diameter for testing magnetisation. The rate of cooling of the chill castings was assessed to be about $10^2$ °C. sec$^{-1}$.

2. Splat casting.

Splat cast alloys were produced by melting the alloy components in a clay graphite crucible with a hole in the base through which the melt could be bottom poured. During melting this hole was sealed by a conical plug attached to the end of the steel tube which contained the thermocouple for checking the temperature of the melt. After melting the temperature was raised to at least 100° C. above the estimated liquidus temperature and the melt was stirred vigorously immediately before casting. The atomising and quenching unit was completely enclosed and was purged with nitrogen before casting. The stopper rod was withdrawn and the lead alloy poured through the bottom of the crucible as a stream about 2 mm diameter and fell into the apex of a cone formed by a number of high velocity gas jets. This broke up the metal stream into fine droplets which were projected downwards onto the surface of a water cooled, chromium plated copper drum 300 mm diameter, rotating at 200 rev.min$^{-1}$. The molten droplets quenched on the surface of the drum and the fine flake produced was collected in the tray below the drum. A stainless steel blade continuously scraped the surface of the drum to prevent build up of particles on the surface. The rate of cooling of the splat cast alloys was assessed to be about $10^5$ °C. sec$^{-1}$.

Flakes produced this way were compacted to 38 mm diameter billets and extruded at room temperature to 6.35 mm diameter rod. The 6.35 mm diameter rod was then drawn at room temperature to give 2.3 mm diameter specimens for magnetisation experiments. Critical current specimens were produced by extruding the flake through a rectangular section die, 25 mm × 3 mm and rolling to produce 0.5 mm thickness strip.

FIGS. 1a and 1b are Cu Kα scanning electron micrographs of chill cast and splat cast specimens respectively (see further under Example 1).

TESTING OF ALLOYS

1. Magnetisation tests.

Figure 5:
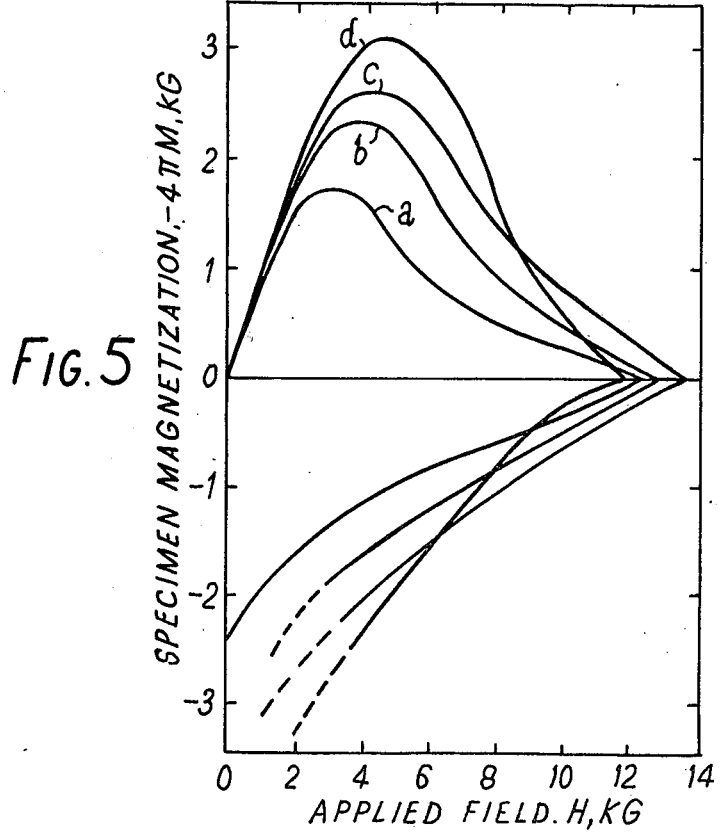

The magnetisation of the sample at 4.2° K was measured in a vibrating sample magnetometer. A superconducting solenoid was used to produce the test field applied to the sample. A pair of sensing coils, wound in opposition, was positioned inside the solenoid and the sample vibrated along the common axis of the solenoid and sensing coils. The sensing coils cancelled out unwanted signals due to the change in the field being applied to the samples by the solenoid but sensed an a.c. signal due to the magnetisation of the sample as it oscillated between them. This a.c. signal was amplified and detected against a second a.c. signal produced from the vibrator which controlled the oscillation of the sample in a phase sensitive detector to give a d.c. signal proportional to the magnetisation. The current in the superconducting solenoid, and thus the magnetic field applied to the specimen, was determined by the voltage drop across a standard resistance. The signal from the phase sensitive detector was applied to the Y axis and the signal across the standard resistance to the X axis of an X-Y recorder. By varying the current supplied to the superconducting solenoid the magnetisation curve of the samples was plotted on the X-Y recorder. The critical field can readily be determined from the X-Y plot. The degree of hysteresis in the plotted curve is a measure of the flux pinning in the sample. FIGS. 2 and 5 are Examples of such hysteresis curves.

DETERMINATION OF CRITICAL CURRENT

2. A 'U' shaped specimen of the alloy being tested was disposed symmetrically along the axis of a superconducting solenoid, at 4.2° K, such that the maximum field generated by the solenoid was transverse to the specimen. The critical current was determined by noting the point at which the voltage across the sample monitored using a sensitive volt-meter (lu V sensitivity) became measurable, it being zero whilst the material is superconducting. By varying the field produced by the solenoid a plot of critical current against transverse field can be produced. Such a plot gives a measure of the amount of current which, say, a superconducting cable made from the test material would be able to carry in operation.

EXAMPLE 1

This Example illustrates the preparation of alloys according to the invention by chill and splat casting and illustrates the advantage of using splat casting.

Alloys having matrix composition of Pb/25% Bi, Pb/30% Bi and Pb/40% Bi each alloy having 1% Cu incorporated therein were made by chill casting from 800° C. A portion of the chill cast metal was re-melted and splat cast from 800° C. Samples prepared from the two castings were compared. The results are set out in Table II and in FIGS. 1, 2 and 3.

Table II

| Nominal Composition (wt %) | Analysed Composition (wt %) | | $H_{c2}$ (kG) | |
|---|---|---|---|---|
| | Bi | Cu | chill cast | splat cast |
| Pb/25% Bi/1% Cu | 24.3 | 1.01 | 10.46 | 10.31 |
| Pb/30% Bi/1% Cu | 30.5 | 1.03 | 12.65 | 12.39 |
| Pb/40% Bi/1% Cu | 38.9 | 0.98 | 13.78 | 13.14 |

The $H_{c2}$ figures given in Table II show that there is no significant difference in upper critical field between the chill and splat cast material but that as expected $H_{c2}$ increases with increasing Bi content.

FIG. 1 shows copper Kα X-ray images produced in a scanning electron microscope (magnification × 750) of the alloy in Table II having a (nominal) composition of Pb/40% Bi/1% Cu. FIG. 1 a) is chill cast and FIG. 1 b) splat cast. FIG. 1 a) shows that relatively coarse copper particles of up to 10 μm diameter are present in the chill cast material. The copper in the splat cast material, FIG. 1 b) is not present as clearly defined particles and must therefore be present as particles smaller than the diameter of the electron beam (0.5μm) giving an average particle size (diameter) well below 0.5μm.

FIGS. 2 a, b and c are plots of specimen magnetisation versus applied magnetic field at 4.2° K for the Pb/25% Bi/1% Cu, Pb/30% Bi/1% Cu and Pb/40% Bi/1% Cu alloys respectively. The magnetisation is in units of −4πM, kG, the applied field in kG. In each case the solid line is the result for splat cast material and the dotted line for chill cast material of the same composition. It is very clear that the degree of hysteresis, and thus the amount of flux pinning is much greater for the splat cast alloy than for the chill cast alloy.

FIG. 3 is a plot of critical current density against applied magnetic field for the alloy in Table II having a (nominal) composition of Pb/30% Bi/1% Cu at 4.2° K. Curve (i) is the chill and curve (ii) the splat cast material. The improvement in critical current density is very marked.

EXAMPLE 2

This Example illustrates a variety of alloys according to the invention and further illustrates the advantage of splat casting.

A variety of samples were made by both chill and splat casting having a selection of disperse phases. The materials were tested as described above and the results shown in Table III.

Table III

Results of Critical Current Tests on Lead Alloys Listed

| Alloy Analysis (wt%) remainder is lead | Condition c = chill cast s = splat cast | Applied Fields (kG) Corresponding to Given Critical Current Densities (A/mm²) | | | | | | | | |
|---|---|---|---|---|---|---|---|---|---|---|
| | | 0 | 1 | 3 | 5 | 10 | 20 | 40 | 60 | 80 |
| 30.4% bismuth-0.17% copper | C | 12.9 | 12.4 | 12.1 | 11.5 | 7.4 | 3.3 | 1.8 | 1.2 | 0.9 |
| 30.5% bismuth-1.03% copper | C | 12.8 | 12.5 | 11.9 | 11.4 | 6.5 | 3.5 | 2.2 | 1.4 | 1.1 |
| 31.6% bismuth-8.6% indium-0.97% copper | C | 11.2 | 10.9 | 9.8 | 8.7 | 6.2 | 3.7 | 2.0 | 1.4 | 1.3 |
| 28.0% bismuth-0.08% nickel | S | 13.7 | 13.4 | 13.0 | 12.9 | 12.7 | 12.5 | 12.1 | 11.7 | 11.1 |
| 26.4% bismuth-0.4% tellurium | S | 13.4 | 13.1 | 12.8 | 12.7 | 12.5 | 12.4 | 12.0 | 11.6 | 11.2 |
| 25.1% bismuth-0.3% selenium | S | 13.9 | 13.5 | 13.2 | 13.0 | 12.8 | 12.6 | 12.4 | 12.1 | 11.3 |
| 24.9% bismuth-0.01% manganese | S | 12.8 | 12.7 | 12.6 | 12.1 | 12.4 | 12.1 | 11.4 | 10.2 | 8.4 |

Figure 4:
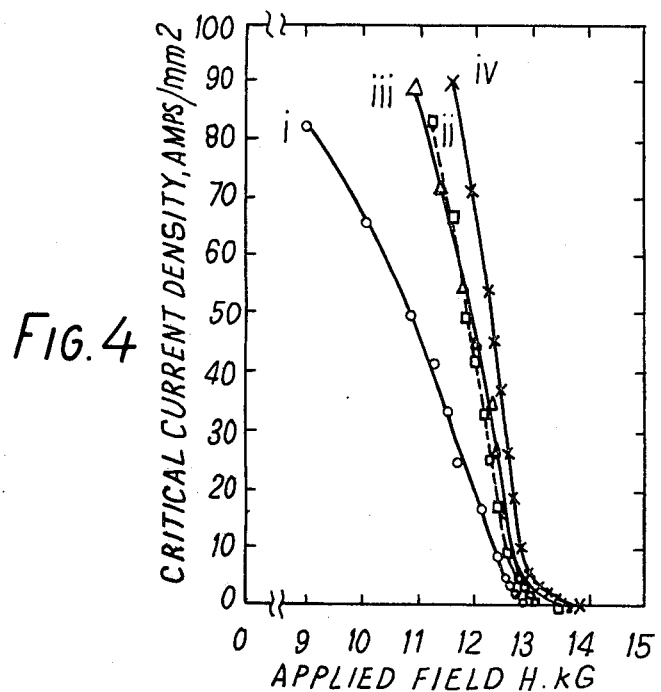

Some of the results of Table III are shown graphically in FIG. 4. The results shown are for the following alloys:

i. Pb/30.5% Bi /1.03% Cu
ii. Pb/26.4% Bi /0.40% Te
iii. Pb/28.0% Bi /0.08% Ni
iv. Pb/25.1% Bi /0.03% Se FIG. 5 shows magnetisation data for two of the alloys above and for two alloys not given in Table III. These alloys are:

a. Pb/30.5% Bi /1.03% Cu
b. Pb/28.0% Bi /0.08 Ni
c. Pb/26.5% Bi /0.70 Se
d. Pb/29.5% Bi /0.60 Ni

What I claim is:

1. An alloy comprising a matrix of a Type II superconductor, which is a homogeneous mixture of lead with 30 to 50 atom % indium, lead with 15 to 40 atom % bismuth, at least 50 atom % lead with at least 5 atom % bismuth and 10 atom % indium, including, dispersed in the matrix, a material to provide pinning centres comprising from 0.01 to 20% by volume of a stable discontinuous phase comprising discrete crystalline particles of copper, manganese, tellurium, selenium, nickel, calcium, chromium, cerium, germanium or lanthanum, either in the form of the element or of a compound with at least one of components of the matrix, wherein the discrete particles have an average diameter of not more than 2 microns.

2. An alloy as claimed in claim 1, wherein the particles of the disperse phase have an average diameter not more than 0.5 microns.

3. An alloy as claimed in claim 1, wherein the matrix comprises a homogeneous mixture of lead with from 15 to 40 atom percent Bi.

4. An alloy as claimed in claim 1, wherein the matrix comprises a homogeneous mixture of lead with from 30 to 50 atom percent In.

5. An alloy as claimed in claim 2 wherein the particles of the disperse phase have an average diameter of not more than 0.1 microns.

6. An alloy as claimed in claim 1 wherein the matrix comprises a homogeneous mixture of about 65 atom percent lead and about 35 atom percent bismuth.

7. An alloy as claimed in claim 1 wherein the disperse phase comprises from 0.05 to 7% by volume.

8. An alloy comprising a matrix of a Type II superconductor which is an homogeneous mixture of from 60 to 85 atom percent lead and from 15 to 40 atom percent bismuth, including dispersed in the said matrix a material to provide pinning centres comprising from 0.01 to 20% by volume of a stable discontinuous crystalline phase of discrete particles selected from the group consisting of copper, selenium, nickel and tellurium either in the form of the element or of a compound with at least one of the components of the said matrix, wherein the discrete particles have an average diameter of not more than 0.5 microns.

9. An alloy as claimed in claim 8 wherein the matrix comprises about 65 atom percent lead and about 35 atom percent bismuth.

10. An alloy as claimed in claim 8 wherein the particles of the discontinuous phase are of one or more of Cu, Se, PbSe, Ni, $Bi_3Ni$, Te, PbTe and $Bi_2Te_3$.

11. An alloy as claimed in claim 8 wherein the disperse phase comprises from 0.05 to 7% by volume.

12. An alloy as claimed in claim 8 wherein the particles of the disperse phase have an average diameter of not more than 0.1 microns.

* * * * *